(12) United States Patent
Sonsky et al.

(10) Patent No.: US 7,671,390 B2
(45) Date of Patent: Mar. 2, 2010

(54) SEMICONDUCTOR DEVICE AND METHOD FOR MANUFACTURE

(75) Inventors: Jan Sonsky, Leuven (BE); Erwin A. Hijzen, Blanden (BE); Michael A. A. In 'T Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 577 days.

(21) Appl. No.: 11/628,130

(22) PCT Filed: May 25, 2005

(86) PCT No.: PCT/IB2005/051715

§ 371 (c)(1),
(2), (4) Date: Nov. 28, 2006

(87) PCT Pub. No.: WO2005/117073

PCT Pub. Date: Dec. 8, 2005

(65) Prior Publication Data

US 2007/0246754 A1    Oct. 25, 2007

(30) Foreign Application Priority Data

May 28, 2004    (GB)    ................. 0411971.5

(51) Int. Cl.
*H01L 29/76*    (2006.01)
*H01L 29/94*    (2006.01)
*H01L 31/062*    (2006.01)
*H01L 31/113*    (2006.01)
*H01L 29/00*    (2006.01)

(52) U.S. Cl. ............... 257/288; 257/501; 257/647; 257/510

(58) Field of Classification Search ............... 257/288, 257/506, 514, 513, 398, 510, 515, 511, 522, 257/528, 501, 758, 647
See application file for complete search history.

(56) References Cited

U.S. PATENT DOCUMENTS

| 4,845,048 | A | 7/1989 | Tamaki et al. | |
| 6,511,886 | B2 * | 1/2003 | Kim et al. | 438/270 |
| 6,828,211 | B2 * | 12/2004 | Chi | 438/424 |
| 2004/0212035 | A1 * | 10/2004 | Yeo et al. | 257/510 |

OTHER PUBLICATIONS

Changong Ren et al: "The Partial Silicon-On-Insulator Technology for RF Power LDMOSFET Devices and On-Chip Microinductors"; IEEE Transactions on Electron Devices vol. 49 No. 12; pp. 2271-2277; 2002.

* cited by examiner

*Primary Examiner*—Chuong A. Luu (57) ABSTRACT

A semiconductor device is formed with a lower field plate (32) and optional lateral field plates (34) around semiconductor (20) in which devices are formed, for example power FETs or other transistor or diode types. The semiconductor device is manufactured by forming trenches with insulated sidewalls, etching cavities (26) at the base of the trenches which join up and then filling the trenches with conductor (30).

15 Claims, 12 Drawing Sheets

SEMICONDUCTOR DEVICE AND METHOD FOR MANUFACTURE

The invention relates to a semiconductor device and method for its manufacture, and in particular to a semiconductor device and manufacturing method that permits isolation of components.

Electronic components such as power electronic devices can be integrated onto complementary metal oxide semiconductor (CMOS) logic chips if the power devices can be isolated and/or shielded from the logic circuits. The isolation may provide full isolation or effective shielding of the power devices to avoid disturbing logic functions, and in particular should ideally allow high-side operation of the power electronic devices with the source terminal of the power electronic devices at high voltage.

Further, the isolation or shielding should occupy as small an area of silicon as possible, and be realised with the minimum number of additional masks and process steps to ensure commercial viability.

One known isolation technique is to use a combination of a buried n-type layer and deep trenches, as set out in Pestel et al, "Development of a robust 50V 0.35 µm based smart power technology using trench isolation", ISPSD 2003 pages 182 to 185.

Another option is to use silicon-on-insulator (SOI) wafers. However, such SOI wafers are often too expensive for competitive production.

A further isolation technique is disclosed in U.S. Pat. No. 4,845,048 (Tamaki et al). In this technique, trenches are formed in silicon, oxide and nitride layers deposited on the sidewalls and then an isotropic dry etch used to etch the silicon under the trenches. Then, the resulting structure is heat treated in an oxidising atmosphere to form oxide. The oxide extends between the trenches to form a continuous oxide layer.

A very similar approach is described in Changong Ren et al, "The partial silicon-on-insulator technology for RF power LDMOSFET devices and on-chip microinductors", IEEE Transactions on Electron Devices Volume 49 Number 12 pages 2271 to 2277 (2002). Again, an oxide platform is formed.

However, these options have not been widely adopted, if at all, and there remains a need for a practical way of gaining some or all of the benefits of a silicon on insulator structure without the expense and manufacturing difficulty of such structures.

According to the invention there is provided a method of manufacturing a semiconductor device, comprising the steps:

(a) providing a semiconductor body with opposed first and second major surfaces;

(b) etching a plurality of laterally spaced longitudinal trenches from the first major surface towards the second major surface;

(c) forming insulator on the sidewalls of the trenches to protect at least part of the sidewalls from etching;

(d) etching cavities at the base of the trenches, the cavities in, laterally adjacent trenches extending laterally under the semiconductor between the trenches to form a continuous laterally extending cavity;

(e) filling the cavities; and (f) forming at least one electronic semiconductor component in the semiconductor body between the trenches, the at least one electronic semiconductor component being a transistor, a diode, and/or a junction semiconductor device.

Unlike the structure of U.S. Pat. No. 4,845,048 discussed above the cavities etched at the base of the trenches are not discrete but join together to form a single laterally extending cavity. This allows increased flexibility in that it permits the use of a wide variety of materials to fill the cavities, not just oxide of semiconductor as in U.S. Pat. No. 4,845,048.

The semiconductor devices have some of the benefits of silicon on insulator (SOI) devices in terms of device isolation. The devices may be used for power semiconductor devices, and also in particular for devices intended to be resistant to α-particles, for example for use in space. Only a limited length of α-particle track will be above the cavities, so a large fraction of any charge generated will be below the cavities away from the device. This reduces sensitivity of the semiconductor device to α-particles.

The method may include depositing a support layer on the first major surface across the trenches to support the region semiconductor body between the trenches when the cavities are etched below that region. The support layer may be removed after the cavities are filled.

Alternatively, the region of the semiconductor body between the trenches may be supported at the ends of the trenches when the cavities are etched below the region.

In embodiments, the step of forming insulator and filling the cavities includes forming insulator on the walls of the cavities; and filling the cavities with conductor.

By manufacturing a semiconductor device in this way, the conductor in the cavities forms a buried field plate under the electronic components.

In other embodiments, the step of forming insulator and filling the cavities includes filling the cavities with insulator. An appropriate insulator can be selected for desirable properties.

In preferred embodiments, a high K material is used to fill, at least partially, the cavities. K is the dielectric constant, and "high-K" is intended to mean having a K value higher than the value K=3.9 for silicon dioxide. The high K material can be for example silicon nitride. In particularly preferred arrangements, the high K material has a value K greater than 8, further preferably greater than 12, for example, hafnium oxide which has a value k~25, and others. The skilled person will be familiar with a number of methods for depositing these materials, for example chemical vapour deposition (CVD), spinning on, etc.

In a particular embodiment a thin oxide liner is formed on the walls of the cavity and the high-K material used to fill the cavity.

The trench may be filled with the same material as the cavity. Alternatively, the trench may be filled with a different material. The material filling the trench may be for example oxide, a high-K material or a number of layers, for example oxide on the side walls and a high-K material in the cavity.

The electronic components may be, for example, power electronic devices such as power MOSFETs, power diodes, or power bipolar transistors.

The invention is of particular benefit in such power electronic devices since these can have a large effect on logic circuits.

The method may further include filling the trenches with conductor. This may act as a field plate reducing the peak electrical field at any junctions and distributing potentials uniformly. The conductor may be grounded. The conductor may also be floating in which case it may act as a shield.

The method may further include forming a conductive field plate over the first major surface at least over the drift region in electrical connection with the conductor in the trenches.

In the case that the electronic components formed in step (f) are field effect transistor devices, step (f) may include:

forming a source region of first conductivity type in the semiconductor body between the trenches at the first major surface;

forming a drain region of first conductivity type in the semiconductor body between the trenches longitudinally spaced from the source region at the first major surface;

forming a body region of second conductivity type opposite the first conductivity type in the semiconductor body between the trenches between the source region and the drain region; and forming an insulated gate adjacent to the body region.

In this way a FET is formed in the semiconductor body between the trenches.

The method may include forming a drift region longitudinally between the body region and the drain region, the drift region being of first conductivity type and of lower doping than the drain region.

In an embodiment the method includes etching an insulated outer trench around the at least one semiconductor component extending from the first major surface towards the second major surface cooperating with the single laterally extending cavity and the longitudinally extending trench regions to isolate the at least one semiconductor component.

In another aspect, the invention relates to a semiconductor device comprising:

a semiconductor body with opposed first and second major surfaces;

a plurality of laterally spaced longitudinal trenches extending from the first major surface towards the second major surface;

insulator on the sidewalls of the trenches;

cavities with insulated sidewalls at the base of the trenches, the cavities in laterally adjacent trenches extending laterally under the semiconductor between the trenches to form a continuous laterally extending cavity;

conductor filling the cavities to form a lower field plate; and at least one electronic semiconductor component in the semiconductor body between the trenches, the at least one electronic semiconductor component being a transistor, a diode, and/or a junction semiconductor device.

The semiconductor device may include conductor filling the trenches in electrical connection with the conductor in the cavities.

A conductive field plate may extend over the first major surface above the drift region in electrical connection with the conductor in the trenches.

The electronic components may include:

a source region of first conductivity type in the semiconductor body between the trenches at the first major surface;

a drain region of first conductivity type in the semiconductor body between the trenches longitudinally spaced from the source region at the first major surface;

a body region of second conductivity type opposite the first conductivity type in the semiconductor body between the trenches between the source region and the drain region; and an insulated gate adjacent to the body region.

The electronic components may further include a drift region longitudinally between the body region and the drain region, the drift region being of first conductivity type and of lower doping than the drain region.

The trenches may have a first trench region laterally adjacent to the source region, and a longitudinally spaced second trench region laterally adjacent to the drift region. The semiconductor body region may extend laterally in the semiconductor passing between the first and second trench regions; and the insulated gate may extend laterally over the semiconductor body region.

There may be an insulated outer trench surrounding the semiconductor components connected to the lower field plate to isolate the semiconductor components. In this way the semiconductor components can be fully isolated.

Accordingly, in an aspect the invention provides a method of manufacturing a semiconductor device, comprising the steps:

(a) providing a semiconductor body with opposed first and second major surfaces;

(b) etching a plurality of laterally spaced longitudinal trenches from the first major surface towards the second major surface;

(c) forming an insulating layer extending laterally at the base of the trenches;

(d) forming at least one electronic semiconductor component in the semiconductor body between the trenches, the at least one electronic semiconductor component being a transistor, a diode, and/or a junction semiconductor device; and (e) forming an isolation trench in contact with the laterally spaced longitudinal trenches and the insulating layer at the base of the trenches cooperating with the laterally spaced longitudinal trenches and the insulating layer at the base of the trenches to isolate the at least one electronic component from the rest of the semiconductor body.

By isolating the semiconductor body in this way a fully isolated semiconductor device can be achieved without the expense of silicon on insulator technology. The invention can be used for example for power devices, which may be integrated on the same semiconductor body as logic circuits using the isolation technique.

Preferably, the longitudinal trenches extend for the full length of the semiconductor devices between the isolation trenches. This eases manufacture and in particular makes it easier to form a relatively uniform insulating layer between the trenches.

The isolation trench may extend around the at least one semiconductor component, the isolation trench extending along both ends of the laterally spaced longitudinal trenches.

Alternatively, the isolation trench may include a first isolation trench portion extending across one end of the laterally spaced longitudinal trenches and a second isolation trench portion extending across the other end of the laterally spaced longitudinal trenches.

The step of forming an insulating layer at the base of the trenches may include forming cavities at the base of the trenches, the cavities extending laterally under the semiconductor between the trenches to form a continuous laterally extending cavity, and filling the cavities.

Alternatively or additionally, the step of forming an insulating layer at the base of the trenches may include: forming cavities at the base of the trenches and oxidising the semiconductor body at the cavities to oxidise the semiconductor between adjacent trenches to form an insulating layer of oxide at the base of the trenches.

In another aspect the invention relates to a semiconductor device comprising:

a semiconductor body with opposed first and second major surfaces;

a plurality of laterally spaced longitudinal trenches extending from the first major surface towards the second major surface;

a laterally extending insulating layer at the base of the trenches;

at least one electronic semiconductor component in the semiconductor body between the trenches, the at least one electronic semiconductor component being a transistor, a diode, and/or a junction semiconductor device; and an isolation trench in contact with the laterally spaced longitudinal trenches and the insulating layer at the base of the trenches cooperating with the laterally spaced longitudinal trenches and the insulating layer at the base of the trenches to isolate the at least one electronic component from the rest of the semiconductor body.

Embodiments of the invention will now be described, purely by way of example, with reference to the accompanying drawings in which.

Like and similar components are given the same reference numerals and the description of such like and similar components are not repeated for each and every embodiment for brevity. The figures are schematic and not to scale.

Figure 1:
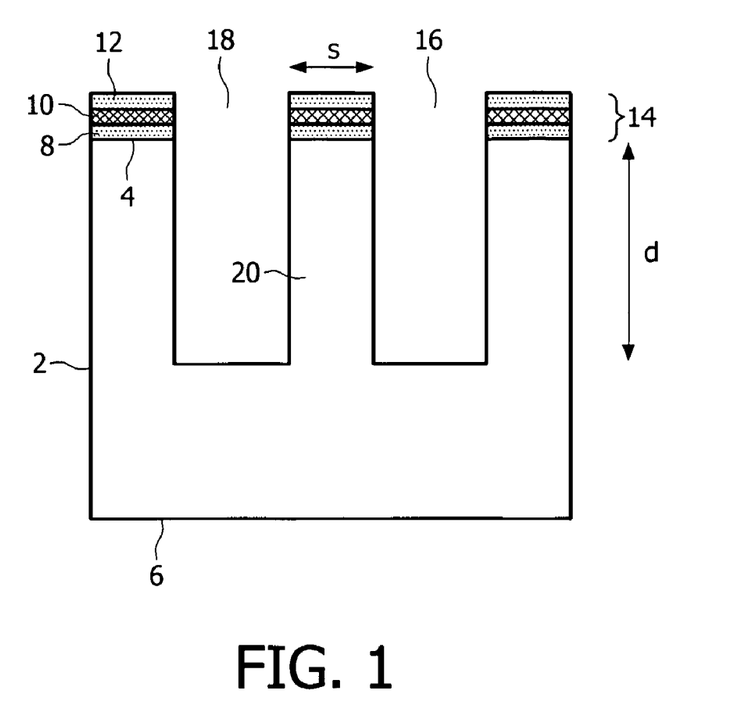
FIG. 1 shows a first step in the manufacture of a semiconductor device according to a first embodiment of the invention.

Referring to FIG. 1, a silicon semiconductor substrate 2 is provided having a first (front) major surface 4 and a second (rear) major surface 6. An oxide layer 8, a nitride layer 10 and another oxide layer 12 are deposited and patterned to form a hard mask 14 defining openings 16. Trenches 18 are then etched using dry etching resulting in the stage shown in FIG. 1.

The lateral spacing s between neighbouring trenches is preferably less than 1 µm, preferably less than 0.5 µm, and in the embodiment shown is 0.2 µm. The depth d of the trenches is preferably in the range 0.4 to 2 µm, in the embodiment shown 1.5 µm. Note that figures are schematic and in particular the vertical scale of the figure is not the same as the horizontal scale for clarity.

Semiconductor 20 remains between the trenches 18.

An optional step may be included here of etching off the upper oxide layer 12 by dipping the structure in HF. Note that this step is omitted in the specific embodiment described.

Figure 2:
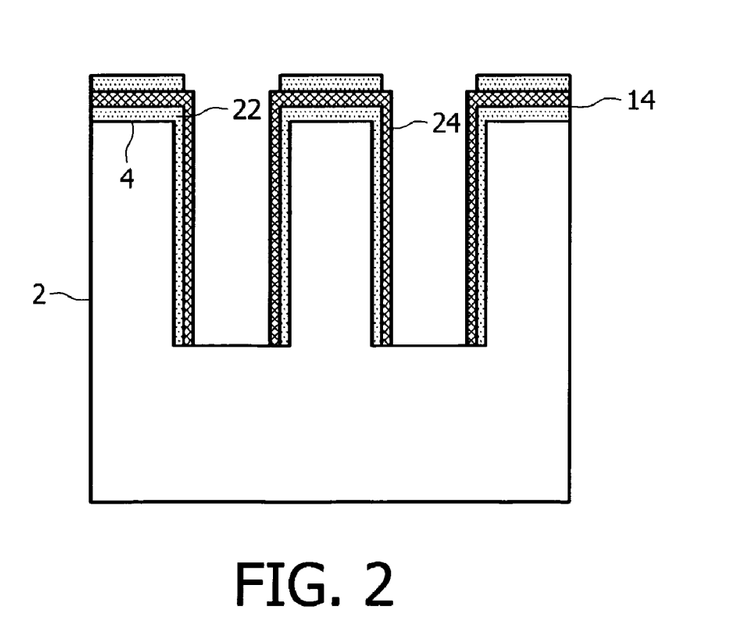
FIG. 2 shows a second step in the manufacture of a semiconductor device according to the first embodiment of the invention.

A dry oxidation step then oxidises the sidewalls and base of the trench 18 forming oxide layer 22, which in the example has a thickness of 30 nm. The oxide layer 22 forms spacers. The top surface is protected with an oxide nitride oxide (ONO) stack, and the oxide layer 22 removed from the base of the trench leaving oxide spacers 22 on the sidewalls of the trench but not the base. Optionally a nitride layer is deposited and etched to form also nitride spacers 24 on the sidewalls of the trench to prevent a formation of oxide on these sidewalls, if oxidation is performed to fill the cavity. This results in the stage shown in FIG. 2.

Figure 3:
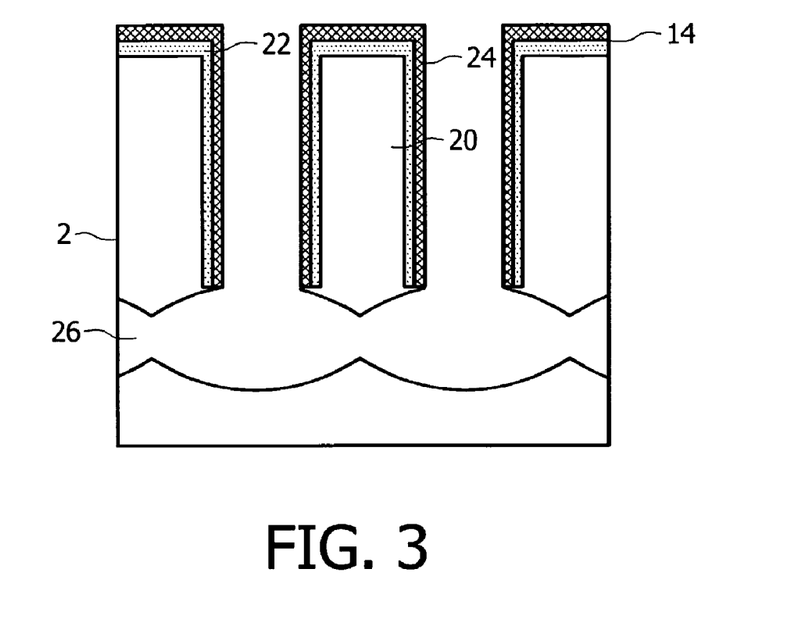
FIG. 3 shows a third step in the manufacture of a semiconductor device according to the first embodiment of the invention.

An isotropic etch is then carried out to etch cavities 26 in the exposed silicon at the base of the trench. The etch is carried out for a sufficient time that the cavities 26 formed under adjacent trenches join together as shown in FIG. 3 forming a single cavity extending laterally under the device.

The semiconductor body 20 is supported in this embodiment by regions longitudinally spaced from the cavity as will be explained below. In other embodiments, other techniques for supporting semiconductor 20 may be used, including for example sacrificial supporting layers, as will be explained below.

Figure 4:
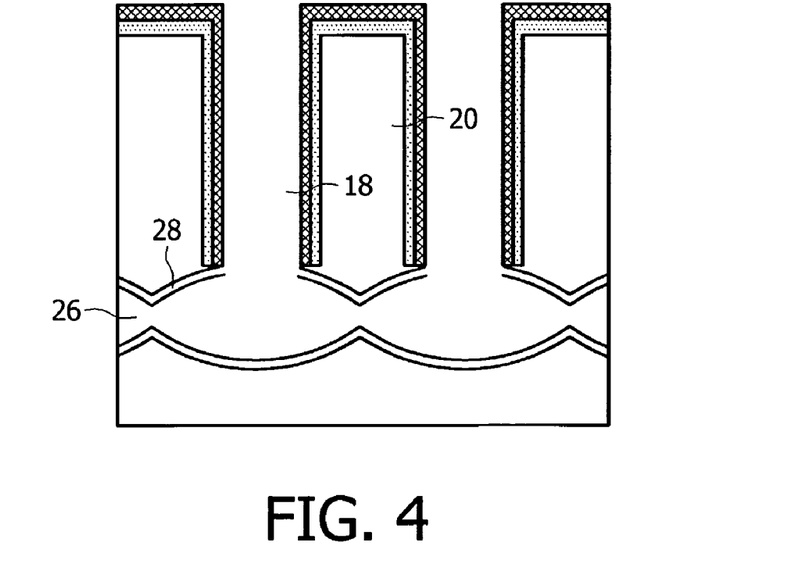
FIG. 4 shows a fourth step in the manufacture of a semiconductor device according to the first embodiment of the invention.

Next, the walls of the cavities 26 are oxidised forming an insulating oxide layer 28 in the cavities as shown in FIG. 4. The oxide layer has approximately the same thickness in the cavities as on the trench sidewalls.

Figure 5:
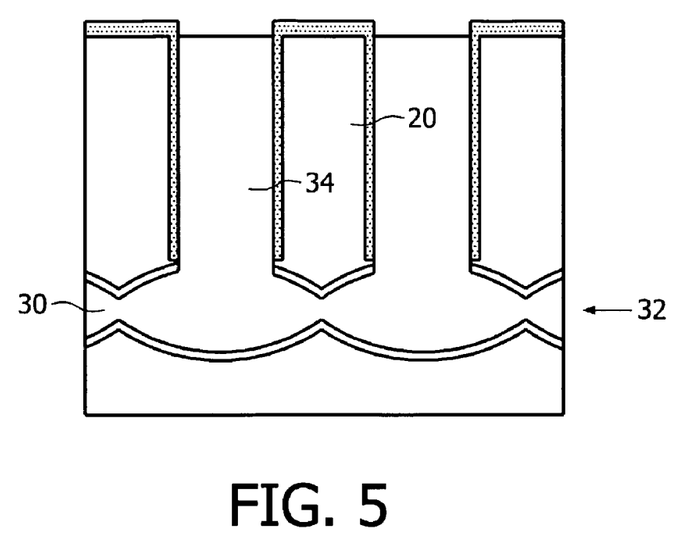
FIG. 5 shows a fifth step in the manufacture of a semiconductor device according to the first embodiment of the invention.

Doped, conductive polysilicon 30 is then deposited in the cavities forming a lower field plate 32 under the semiconductor 20 and lateral field plates 34 on either side of the semiconductor 20, as shown in FIG. 5.

Semiconductor components 36, in this instance FETs, are then formed using processing steps known to those skilled in the art. In this embodiment, formation of the semiconductor components 36 after the oxidation step of the cavity is preferred since the conditions for carrying out the oxidation would cause any implants in the semiconductor components 36 to diffuse.

Figure 6:
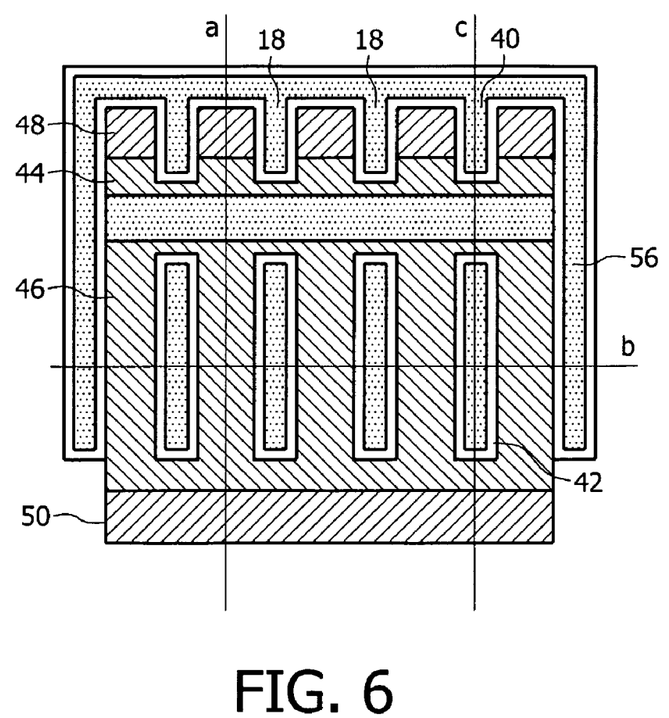
FIG. 6 shows a top view of a semiconductor device according to the first embodiment.
Figure 7:
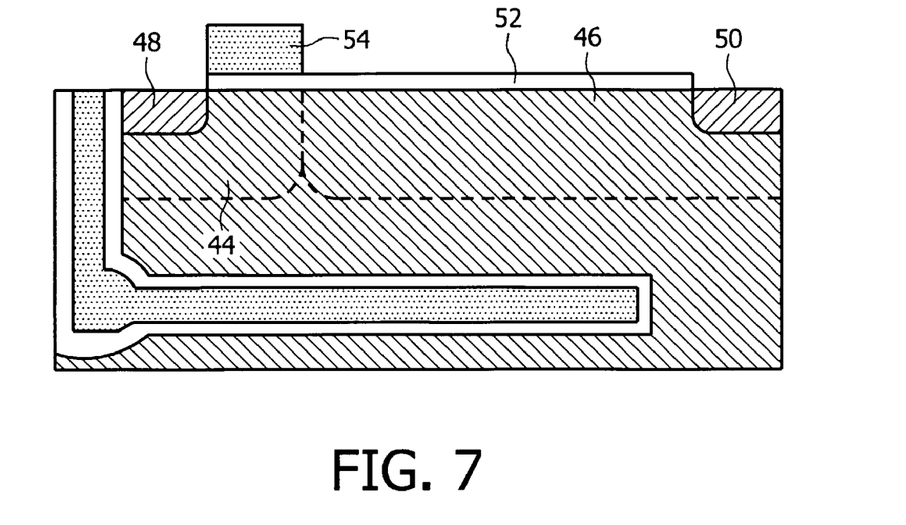
FIG. 7 shows a section along a-a of FIG. 6.
Figure 8:
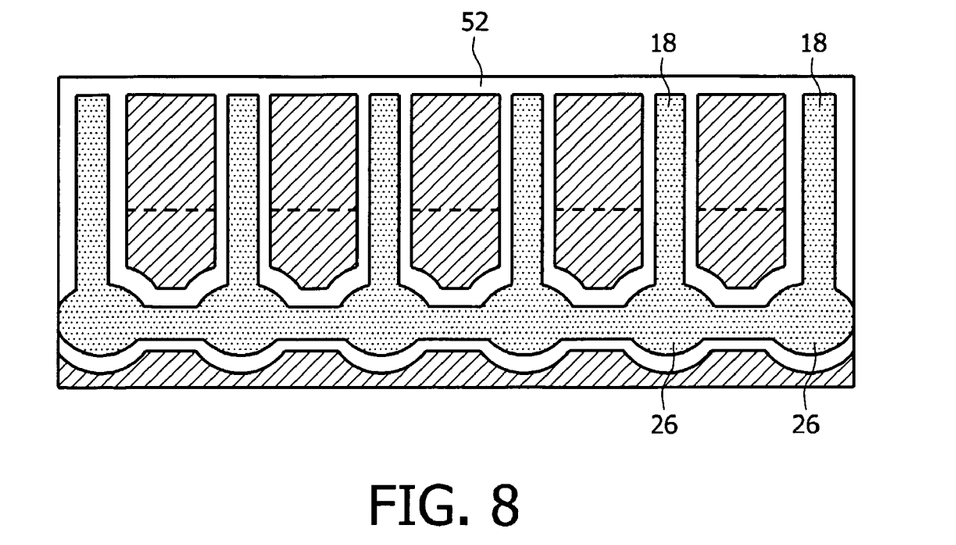
FIG. 8 shows a section along b-b of FIG. 6.
Figure 9:
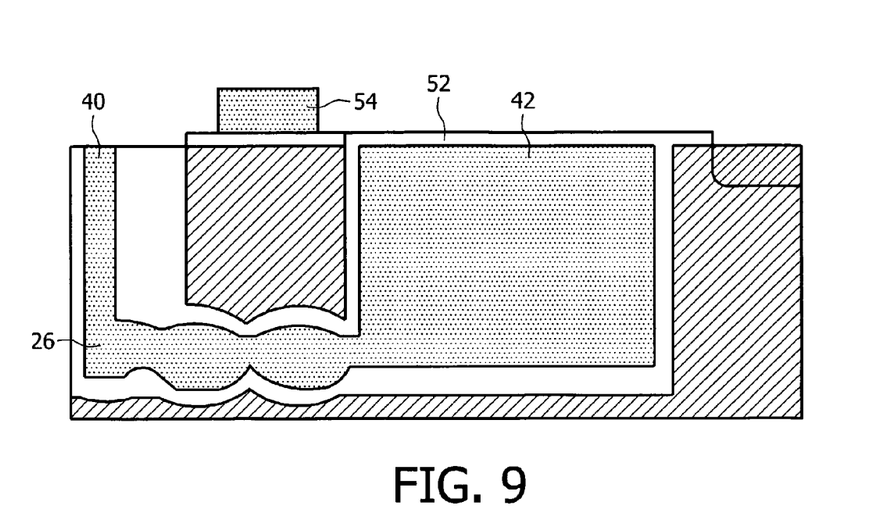
FIG. 9 shows a section along c-c of FIG. 6.

FIG. 6 shows a top view of the finished device and FIG. 7 to 9 show side views along sections a-a, b-b and c-c of FIG. 6 respectively.

As can be seen from FIGS. 6 to 9, trenches 18 are not continuous but are divided into a first section 40, and a second section 42.

A body region 44 is formed at one end of the trenches and a drift region 46 at the other end. Then, source region 48 is formed in the body region 44 and drain region 50 is formed at the end of the drift region. In the embodiment, the source and drain regions are highly doped n-type, the drift region is doped n-type, and the body region 44 is doped p-type. The skilled person will realise that these doping types can be reversed.

The body region 44 is connected laterally through the gaps between the first and second regions 40,42 of the trenches.

Gate insulator 52 extends laterally over the body region 44 where it is at the first major surface 4, and gate 54 is provided extending laterally over the gate insulator.

During manufacture, the semiconductor that will form the source adjacent to the first trench 40 is supported from the body region 44 that extends across the trenches. The semiconductor that will form the drift region 50 adjacent to the second trench 42 is supported at one end by the body region 44 and at the other by the semiconductor of and under the drain region 50.

The skilled person will realise that the trenches can alternatively simply extend longitudinally for the whole length of the device. This simplifies processing.

As well as the longitudinally extending trenches, isolation trench 56 extends around the devices The isolation trench 56 is formed in the same steps as the trench 18, and has the same structure.

Figure 10:
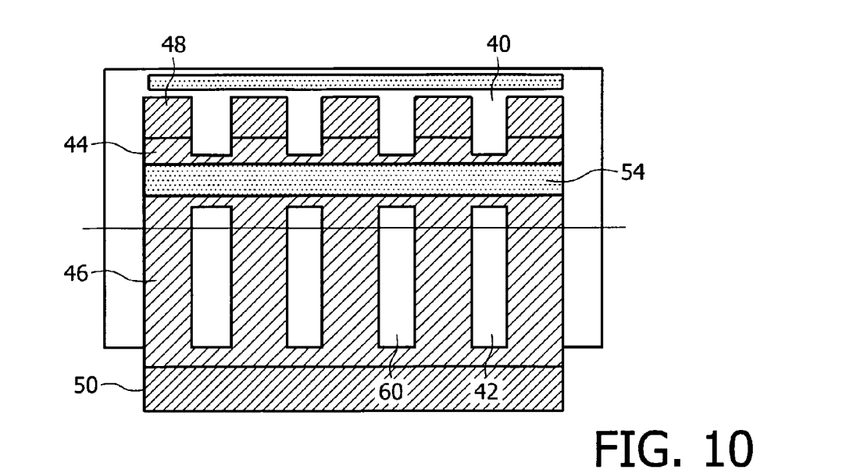
FIG. 10 shows a top view of a second embodiment of the invention.
Figure 11:
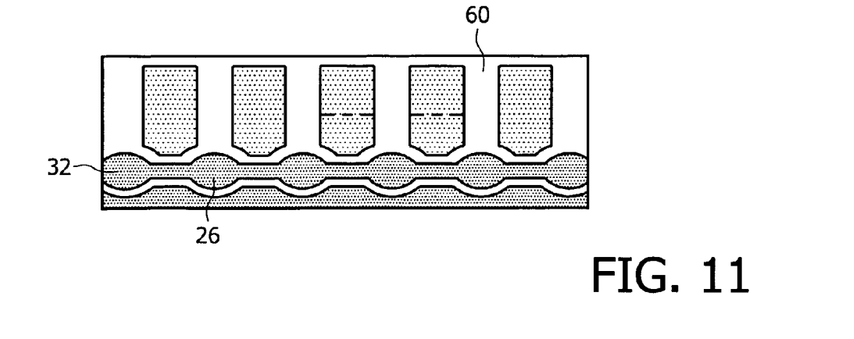
FIG. 11 shows a section of the embodiment of FIG. 10.

In a second embodiment of the device shown in FIGS. 10 and 11, the cavities 26 are filled with conductor forming lower field plate 32 but the trenches 18 are filled not with conductor but with insulator 60. This is achieved by filling the trenches and cavities with polysilicon as in the first embodiment, and then etching back the polysilicon to the depth of the trench 18. The trench is then filled with dielectric insulator 60.

Figure 12:
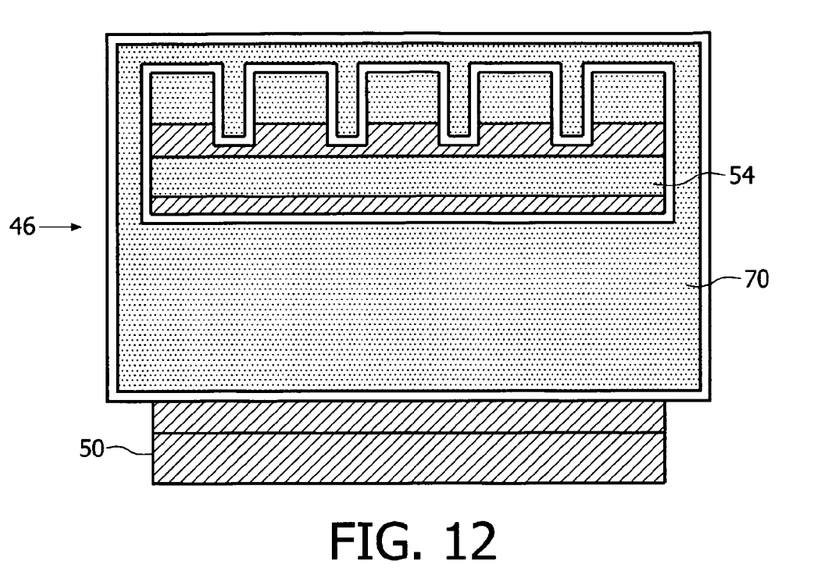
FIG. 12 shows a top view of a third embodiment of the invention.
Figure 13:
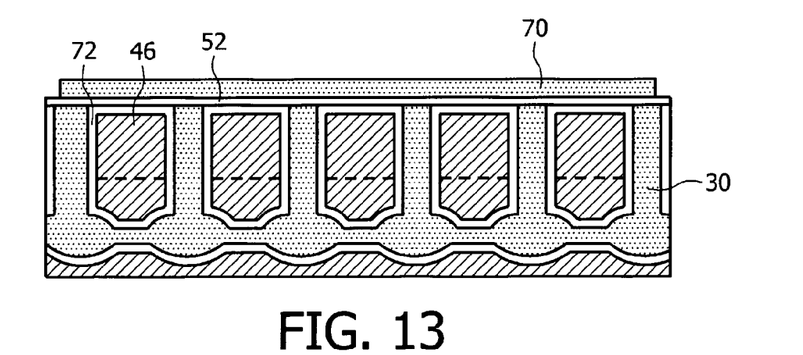
FIG. 13 shows a section of the embodiment of FIG. 12.

The third embodiment shown in FIGS. 12 and 13 differs from the first in that an upper field plate 70 is provided over the first major surface 4, in particular over drift region 46. The method proceeds as for the first embodiment until the stage shown in FIG. 3. Then, the remainder of the hard mask 14 and the insulating layers 22,24 are completely removed, for example using a wet etch. An oxide layer 72 is then grown of uniform thickness in the cavities 26, on the trench 18 sidewalls and on the first major surface 4. Conductive polysilicon 30 is deposited to fill the cavities 26 and trenches 18 and etched back to the first major surface. Gate oxide 52 is grown on the exposed silicon surfaces, thus on the polysilicon 30 in the trench as well as on the top of the body region 44. Next, the upper field plate 70 is deposited in the same step as gate 54 and patterned using the same mask as the gate 54. The upper field plate 70 is connected to the conductive polysilicon in the trench by a metal contact (not shown).

Thus, in this arrangement, field plates are provided above, to the side, and below the body region 44.

Figure 14:
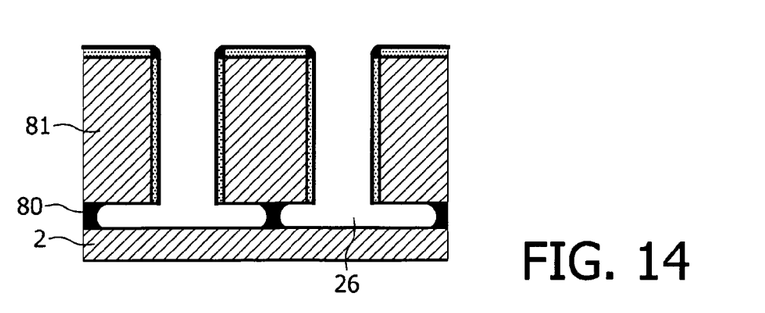
FIG. 14 shows a side section of a fourth embodiment of the invention.

The fourth embodiment of FIG. 14 starts by forming a heavily doped layer 80 at the first major surface of a substrate 2. Then, a silicon epitaxial layer 81 is grown over the surface to the same thickness as the trench depth d. Thus, the first major surface 4 is the surface of the epitaxial layer and there is a highly doped buried layer 80 at the bottom of the trenches 18 after they are formed.

The etch step forming the cavities 26 then proceeds anisotropically even if conventional isotropic etch steps are used since the buried layer 80 is preferentially etched. This ensures that the cavities 26 extend laterally through the buried layer and join up without requiring excessive depth.

The above description relates to forming FETs in the semiconductor body between the trenches 18. The skilled person will appreciate that other components may be formed if required.

The invention also relates to arrangements in which the cavities are filled with insulator, not conductor. The cavities may be filled by deposition or growth, for example of oxide, or other methods that will be familiar to those skilled in the art. Specific structures with insulator will now be described.

Figures 15, 16:
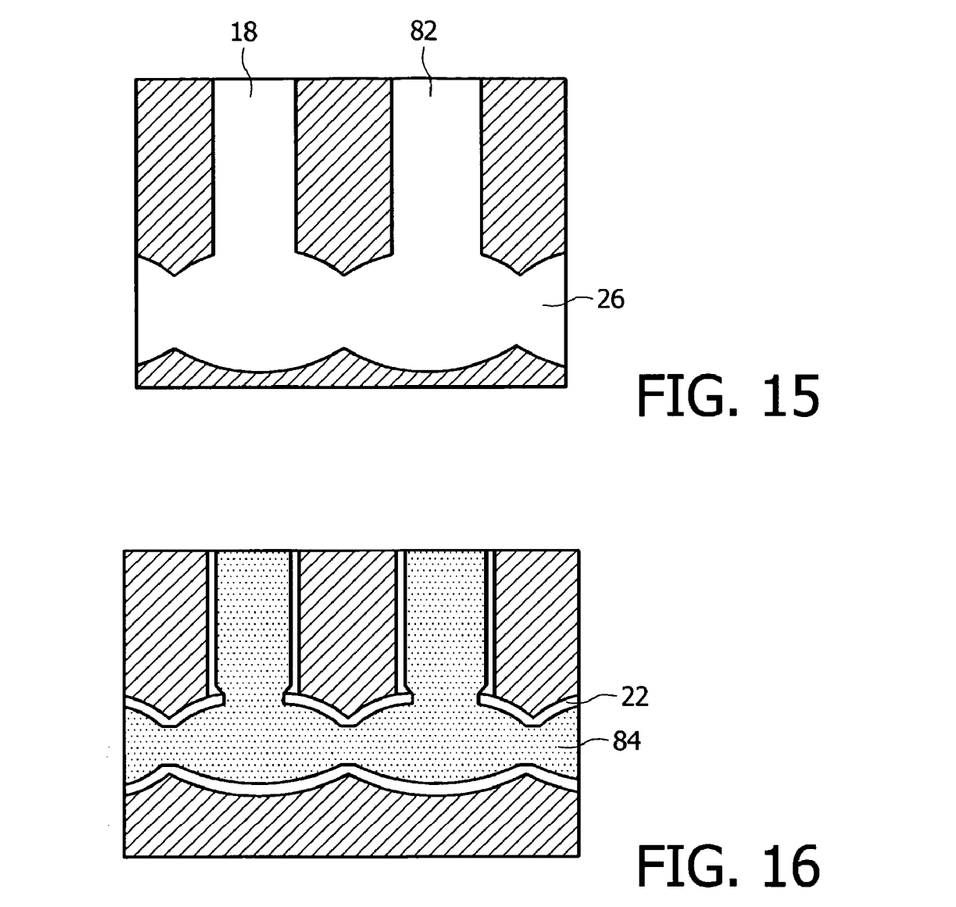
FIG. 15 shows a side section of a fifth embodiment of the invention.
FIG. 16 shows a side section of a sixth embodiment of the invention.

In the arrangement of FIG. 15, a single dielectric 82 is used to fill the cavities 26 and trenches 18, instead of conductor 30. Thus, dielectric 82 forms an insulating layer extending laterally at the base of the trenches. In a variation of this approach, not shown, the dielectric 82 is filled only in the cavities, not in the trenches.

FIG. 16 shows an alternative approach in which oxide 22 is deposited on the sidewalls of the trenches 18 and cavities 26, and then dielectric 84 is filled into the cavities 26 and trenches 18. Again, in a variation the cavities only are filled.

Figure 17:
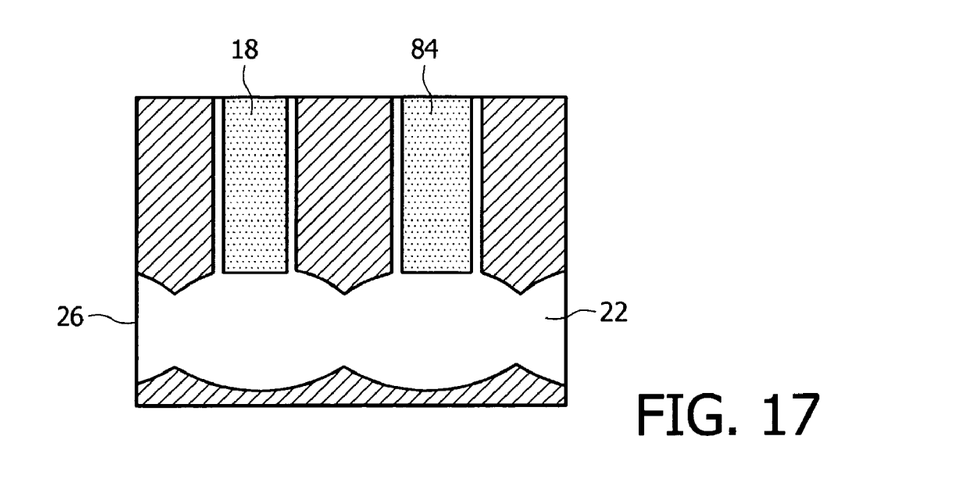
FIG. 17 shows a side section of a seventh embodiment of the invention.

FIG. 17 illustrates an approach in which oxide 22 is used to fill the cavities 26 and is also deposited on the sidewalls of the trenches 18. A high-K dielectric 84 is deposited in the trenches 18. In this way a high-K dielectric can be used adjacent to the body. In an alternative, the oxide 22 is not formed on the sidewalls and the dielectric 84 fills trenches 18.

Figure 18:
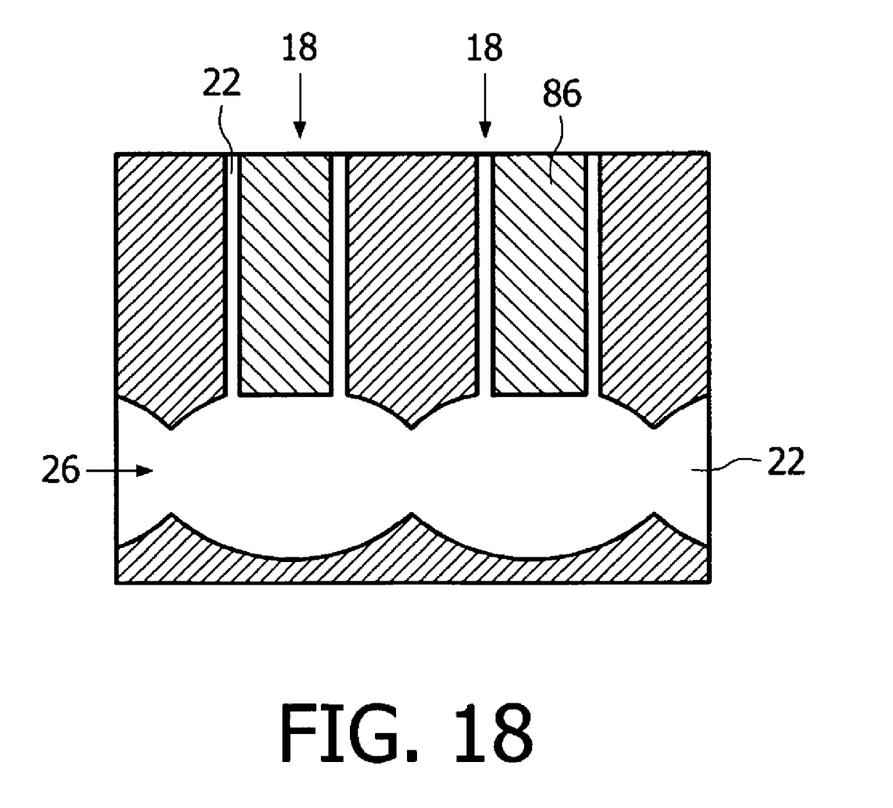
FIG. 18 shows a side section of an eighth embodiment of the invention.

As shown in FIG. 18, the dielectric 84 of the arrangement of FIG. 17 may be replaced by conductor 86 in the trenches 18, between the oxide layers 22. The conductor 86 may be of polysilicon, metal etc.

The above embodiments are not fully isolated, i.e. there is no cavity under the drain so there is a path from the drain to the substrate 2.

In an alternative arrangements the semiconductor device is fully isolated. Structures achieving this using dielectric in cavities 26 will now be described, though the skilled person will realise that the same approaches can be used in arrangements where the cavity has insulator on the sidewalls and is filled with conductor.

Figure 19:
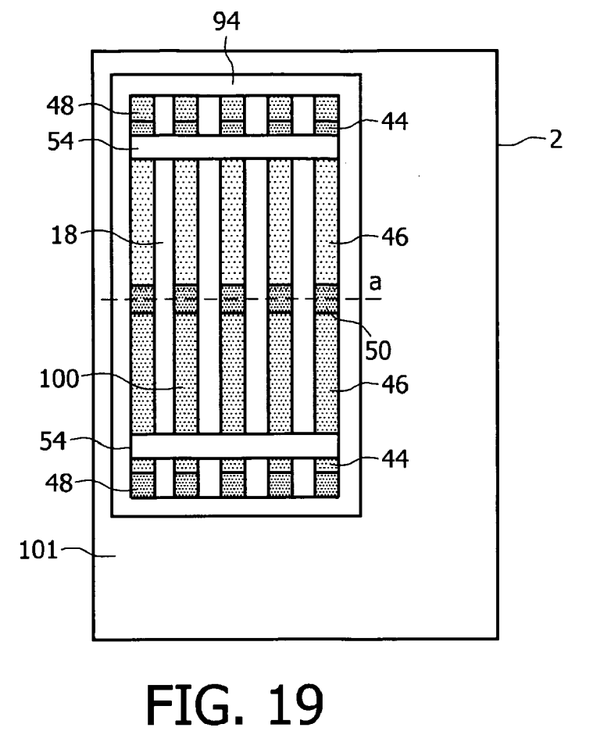
FIG. 19 shows a top view of a ninth embodiment of the invention.
Figure 20:
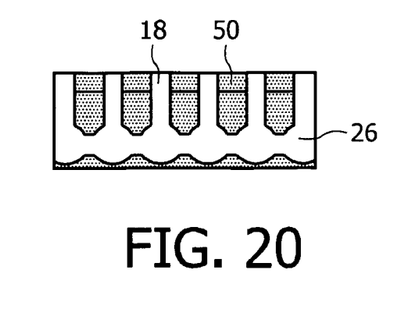
FIG. 20 shows a side section through the embodiment of FIG. 19.

Isolation may be achieved using the structure of FIGS. 19 and 20, in which FIG. 20 is a cross section across line a of FIG. 19. Note that this embodiment uses single longitudinal trenches 18. In this approach, after etching the cavities, and filling the cavities to support the bridges once again, an isolation trench mask is used to etch an isolation trench 94 around the device or devices formed. The isolation trench 94 is then filled with dielectric. By selecting a suitable spacing and depth of isolation trench, the isolation trench connects with the cavities 26 and so isolates the devices in the semiconductor region 100 between the trenches.

Logic circuits 101 can be formed on areas of the semiconductor 2 away from the semiconductor region 100 in which semiconductor components are formed thereby allowing integration of logic circuits and power components on a single substrate.

Figure 21:
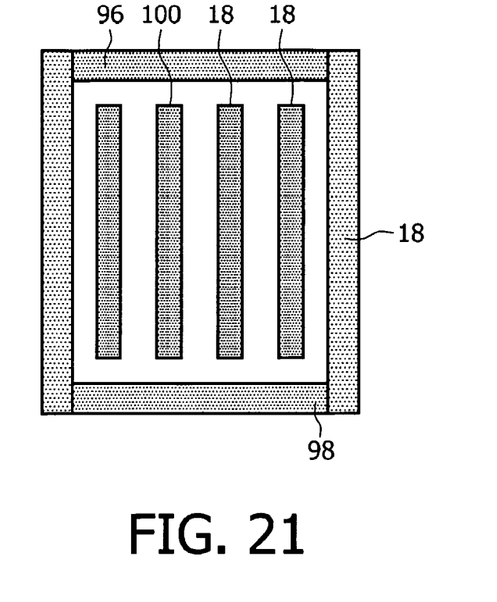
FIG. 21 is a top view of a step in the manufacture of a device according to the invention.

In another approach, shown in FIG. 21, the isolation trench mask 94 forms two partial trenches 96,98, each extending laterally across the ends of the longitudinal trenches 18, and cooperating with the longitudinal trenches and the cavities 26 to isolate the devices in semiconductor region 100.

By using these approaches, the semiconductor in region 100 can be supported at the longitudinal ends when the cavities 26 are etched away, and then after the semiconductor 100 is supported by the material filling the cavities the isolation trenches can be formed.

Another option is to form the isolation trenches 94 at the same time as trenches 18. This requires the semiconductor region 100 to be supported since the cavities 26 completely underetch this region.

Figure 22:
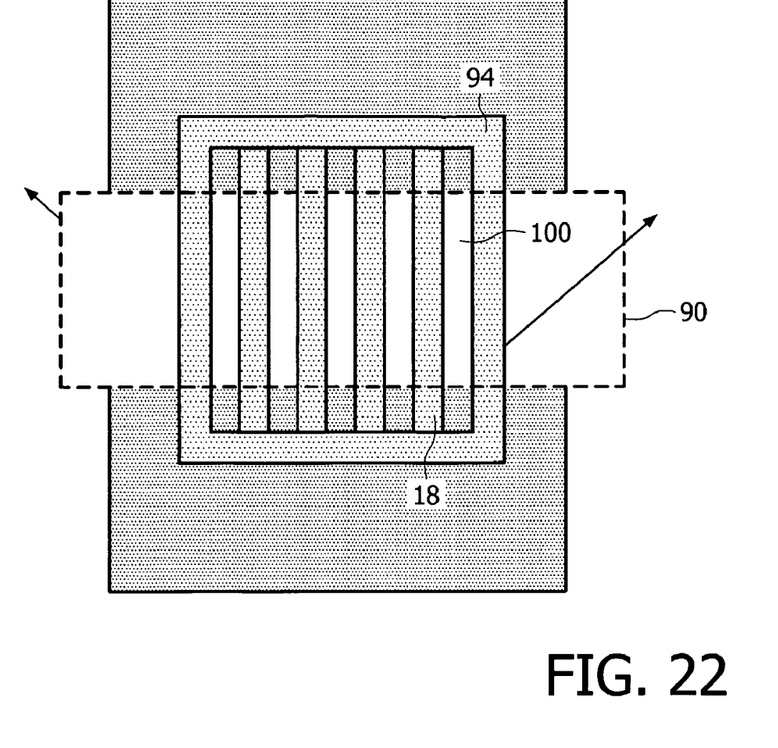
FIG. 22 is a top view of a step in an alternative method for the manufacture of a device according to the invention.

FIG. 22 illustrates one approach in which a support beam 90 is formed on the surface after etching the trenches 18, 94 formed in a single etch step. The support beam is a sacrificial patterned layer deposited before the cavities are etched to support the semiconductor when the step of etching the cavities etches away all support under the semiconductor bridges.

Figure 23:
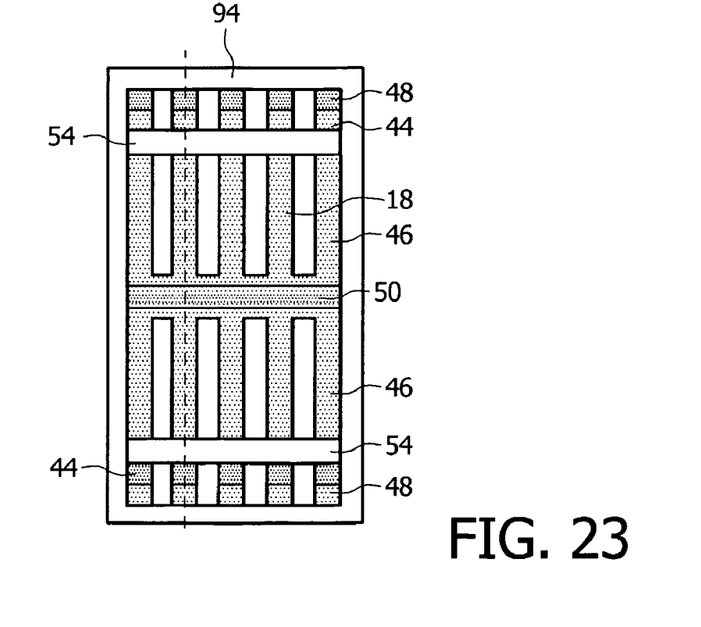
FIG. 23 is a side section of an eleventh embodiment of the invention.

In alternative approach, the device is not fully isolated. In the approach of FIG. 23, the trenches 18 do not extend to drain 50. In this case, an outer isolation trench 94 is used. The isolation trench isolates the device laterally from other devices on the same substrate, though in this case the devices are not fully isolated from the substrate and therefore are connected through the substrate in the event that the substrate is conducting. The reduced surface field benefits of the trenches remain.

In a modification of this approach, the cavities are not formed to join up under the drift region.

Figure 24:
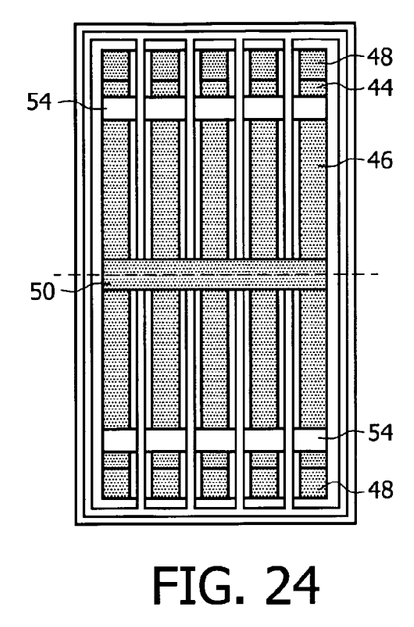
FIG. 24 is a top view of a twelfth embodiment of the invention.
Figure 25:
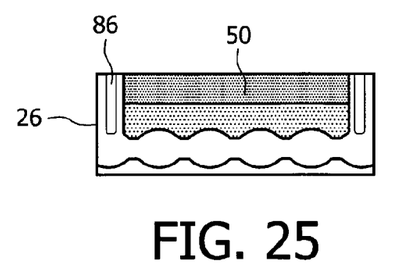
FIG. 25 is a side section through the embodiment of FIG. 24.

Even where the cavities are insulated the use of conductor in the trenches gives rise to benefits, especially where the conductor in the trenches can act as a field plate giving reduced surface field effects, as shown in FIGS. 24 and 25. Conductor 86 in the trenches effectively acts as a field plate. Note that this approach can be combined either with fully isolated or partially isolated embodiments.

Figure 26:
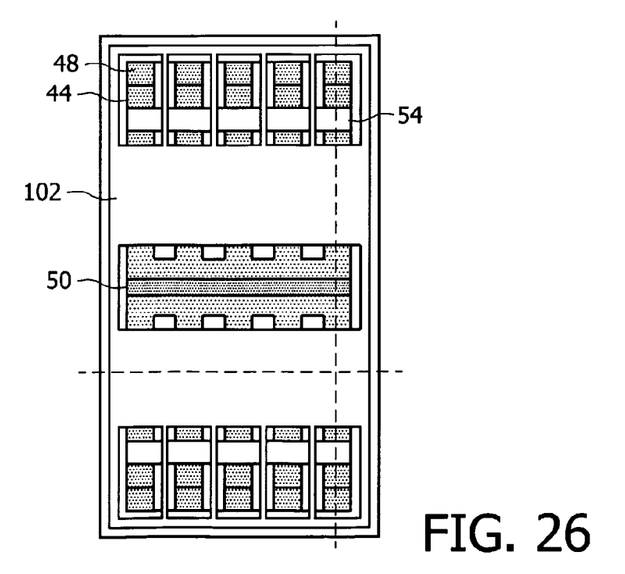
FIG. 26 is a top view of a thirteenth embodiment of the invention.
Figure 27:
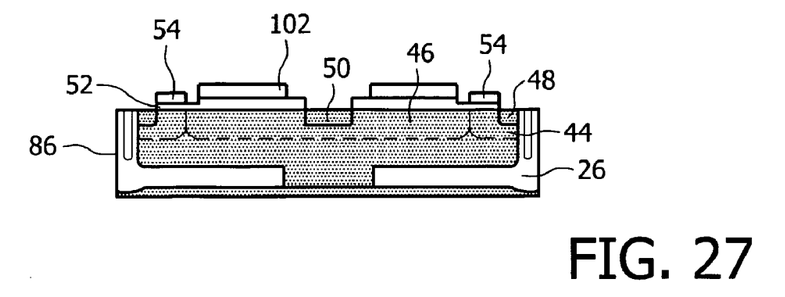
FIG. 27 is a side section through the embodiment of FIG. 26.

FIGS. 26 and 27 shows a further approach for such devices with a separate gate 54 and field plate 102 on the surface. In this case, the field plate 102 is connected to the conductor 86 in the trenches as shown in the cross section. Thus, there is an effective field plate both above and to the side of the drain region of the semiconductor device. The field plate 102 is spaced from drift region by a thicker oxide layer 104 than gate oxide layer 52.

Figure 28:
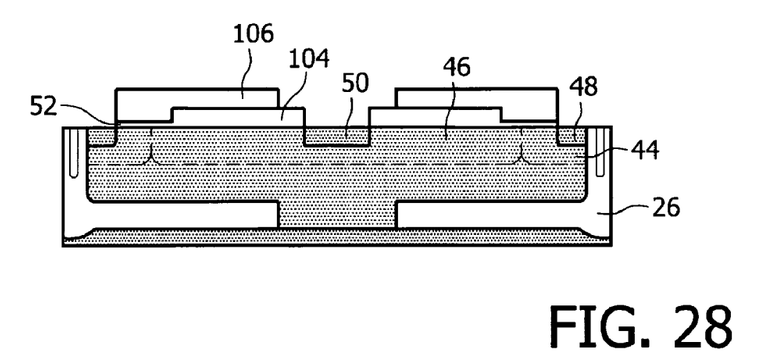
FIG. 28 is a side section through a fourteenth embodiment of the invention.

Alternatively, as illustrated in FIG. 28, a single conductor 106 may form both gate 52 and field plate 102, over both gate oxide layer 52 and thicker oxide layer 100. In the example, the gate oxide 52 is present between the conductor and the trench over the trench and the conductor in the trench is connected at the source ends.

Although the arrangements of FIGS. 19 to 28 have been described in versions in which the cavities 26 are filled with dielectric, they may also be implemented using cavities filled with conductor.

Figure 29:
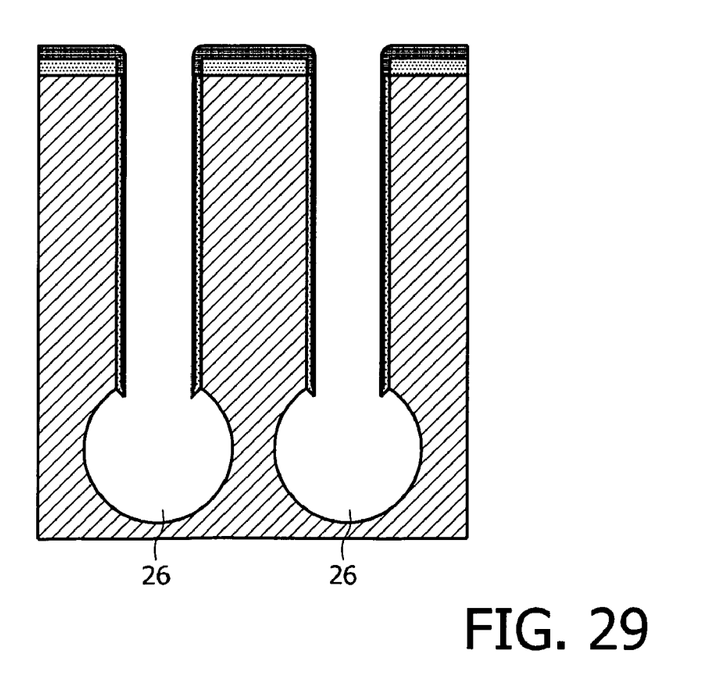
FIG. 29 is a side section through an alternative method step used in the manufacture of the invention.

Further, these arrangements can be used with an approach in which the cavities 26 do not connect laterally as shown in FIG. 29. In this case, oxidation is used to oxidise the semiconductor between the cavities to form an insulating region at the base of the trenches from which processing can continue as in the previous embodiments.

The skilled person will realise that these approaches can be combined. n-type and p-type regions may be interchanged, and that different materials may be substituted for those specifically described.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

There is no need to use silicon, but the invention is also applicable to other group IV, III-V or II-VI semiconductors and indeed any other semiconductor material.

The invention claimed is:

1. A semiconductor device comprising:
    a semiconductor body with opposed first and second major surfaces;
    a plurality of laterally spaced longitudinal trenches extending from the first major surface towards the second major surface;
    cavities with insulated sidewalls at the base of the trenches, the cavities in laterally adjacent trenches extending laterally between the trenches to form a continuous laterally extending cavity;
    a filler filling the cavities; and
    at least one electronic semiconductor component in the semiconductor body between the trenches, the at least one electronic semiconductor component being a transistor, a diode, and/or a junction semiconductor device.

2. A semiconductor device according to claim 1 wherein the filler in the cavities includes insulator on the sidewalls of the cavities and conductor filling the cavities.

3. A semiconductor device according to claim 1 wherein the filler in the cavities is insulating.

4. A semiconductor device according to claim 3 wherein the filler in the cavities includes oxide on the sidewalls of the cavities and a high-K filler.

5. A semiconductor device according to claim 1 comprising conductor filling the trenches.

6. A semiconductor device according to claim 5 further comprising an upper conductive field plate extending over the first major surface in electrical connection with the conductor in the trenches.

7. A semiconductor device according to claim 1 wherein the semiconductor devices include:
    a source region of first conductivity type in the semiconductor body between the trenches at the first major surface;
    a drain region of first conductivity type in the semiconductor body between the trenches longitudinally spaced from the source region at the first major surface;
    a body region of second conductivity type opposite the first conductivity type in the semiconductor body between the trenches between the source region and the drain region; and
    an insulated gate adjacent to the body region.

8. A semiconductor device according to claim 7 further comprising a drift region longitudinally between the body region and the drain region the drift region being of first conductivity type and of lower doping than the drain region.

9. A semiconductor device according to claim 8 wherein the trenches have a first trench region laterally adjacent to the source region:
    a longitudinally spaced second trench region laterally adjacent to the drift region;
    a semiconductor body region extending laterally in the semiconductor passing between the first and second trench regions; and
    an insulated gate extending laterally over the semiconductor body region.

10. A semiconductor device according to any of claim 1, comprising an insulated outer trench around the semiconductor components cooperating with the cavities and optionally the trenches to isolate the semiconductor components.

11. A semiconductor device comprising:
a semiconductor body with opposed first and second major surfaces;
a plurality of laterally spaced longitudinal trenches extending from the first major surface towards the second major surface;
a laterally extending insulating layer at the base of the trenches;
at least one electronic semiconductor component in the semiconductor body between the trenches, the at least one electronic semiconductor component being a transistor, a diode, and/or a junction semiconductor device; and
an isolation trench in contact with the laterally spaced longitudinal trenches and the insulating layer at the base of the trenches, said isolation trench cooperating with the laterally spaced longitudinal trenches and the insulating layer at the base of the trenches to isolate the at least one electronic component from the rest of the semiconductor body.

12. A device according to claim 11 wherein the isolation trench extends around the at least one semiconductor component, the isolation trench extending along the ends of the laterally spaced longitudinal trenches.

13. A device according to claim 11 wherein the isolation trench includes a first isolation trench portion extending across one end of the laterally spaced longitudinal trenches and a second isolation trench portion extending across the other end of the laterally spaced longitudinal trenches.

14. A device according to claim 11 wherein the insulating layer at the base of the trenches includes filled cavities at the base of the trenches, the cavities extending laterally under the semiconductor between the trenches to form a continuous laterally extending cavity.

15. A device according to claim 11 wherein the insulating layer at the base of the trenches includes a layer of oxide extending between adjacent trenches.

* * * * *